United States Patent
Mungekar et al.

(10) Patent No.: US 7,704,897 B2
(45) Date of Patent: Apr. 27, 2010

(54) HDP-CVD SION FILMS FOR GAP-FILL

(75) Inventors: Hemant P. Mungekar, Campbell, CA (US); Young S. Lee, San Jose, CA (US); Agnieszka Jakubowicz, Los Gatos, CA (US); Zhong Qiang Hua, Saratoga, CA (US); Rionard Purnawan, Mountain View, CA (US); Sanjay Kamath, Fremont, CA (US); Walter Zygmunt, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/035,603

(22) Filed: Feb. 22, 2008

(65) Prior Publication Data

US 2009/0215281 A1 Aug. 27, 2009

(51) Int. Cl.
*H01L 21/316* (2006.01)
(52) U.S. Cl. .............................. 438/786; 257/E21.271
(58) Field of Classification Search .................. 438/69, 438/72, 763, 786; 257/E21.271
See application file for complete search history.

(56) References Cited

U.S. PATENT DOCUMENTS

| | | | | |
|---|---|---|---|---|
| 4,394,401 | A * | 7/1983 | Shioya et al. | 427/574 |
| 6,096,656 | A * | 8/2000 | Matzke et al. | 438/702 |
| 6,170,428 | B1 | 1/2001 | Redecker et al. | |
| 6,813,432 | B2 | 11/2004 | Salib | |
| 7,141,138 | B2 | 11/2006 | Gondhalekar et al. | |
| 7,229,931 | B2 | 6/2007 | Mungekar et al. | |
| 2002/0004292 | A1 * | 1/2002 | Yamazaki et al. | 438/487 |
| 2003/0110808 | A1 | 6/2003 | M'Saad et al. | |
| 2004/0017962 | A1 * | 1/2004 | Lee et al. | 385/14 |
| 2005/0191830 | A1 * | 9/2005 | Collins et al. | 438/514 |
| 2005/0279998 | A1 * | 12/2005 | Cole et al. | 257/59 |
| 2006/0104564 | A1 | 5/2006 | Catrysse et al. | |

OTHER PUBLICATIONS

Tedrow, P. K. (2002). PECVD of Dielectric Films, In ASM Handbooks Online [Web]. ASM International. Retrieved Mar. 12, 2009, from http://products.asminternational.org/hbk/.*
Mungekar, Hemant P., et al. "High density plasma chemical vapor deposition gap-fill mechanisms", *J. Vac. Sci. Technology* B (2006) 24(2):L11-L15.

(Continued)

*Primary Examiner*—W. David Coleman
*Assistant Examiner*—Daniel Shook
(74) *Attorney, Agent, or Firm*—Townsend and Townsend and Crew

(57) ABSTRACT

The present invention pertains to methods of depositing low stress/high index multi-layer films on a substrate using an HDP-CVD process. The multi-layer films include two lining layers and a bulk gap-fill layer and the HDP-CVD process employs a reduced substrate bias power during deposition of at least the second lining layer. Deposition of the three layers occurs at reduced deposition temperatures which further reduces the stress of the multi-layer film. The lower stress results in less defectivity which improves the films ability to maintain optical confinement of radiation.

27 Claims, 9 Drawing Sheets

OTHER PUBLICATIONS

Suo, Z. "Fracture in Thin Films", *Encyclopedia of Materials: Science and Technology* (2001) 2nd ed. (Elsevier Science), pre-publication, pp. 1-17.

Abe, Hideshi "Device technologies for high quality and smaller pixel in CCD and CMOS image sensors", *IEEE* (2004), pp. 40.1.1-40.1.4.

Magnan, Pierre "Detection of visible photons in CCD and CMOS: A comparative view", *Nuclear instruments and Methods in Physics Research* (2003) A 504:199-212.

Konofaos, N., et al. "Dielectric properties of CVD grown SiON thin films on Si for MOS microelectronic devices", *Semiconductor Science and Technology* (2004) 19:50-5.

* cited by examiner

HDP-CVD SION FILMS FOR GAP-FILL

BACKGROUND OF THE INVENTION

The present invention relates to nano-manufacturing technology solutions involving equipment, processes, and materials used in the deposition, patterning, and treatment of thin-films and coatings, with representative examples including (but not limited to) applications involving: semiconductor and dielectric materials and devices, silicon-based wafers, flat panel displays (such as TFTs), masks and filters, energy conversion and storage (such as photovoltaic cells, fuel cells, and batteries), solid state lighting (such as LEDs and OLEDs), magnetic and optical storage, micro-electro-mechanical systems (MEMS) and nano-electro-mechanical systems (NEMS), micro-optic and optoelectronic devices, architectural and automotive glasses, metallization systems for metal and polymer foils and packaging, and micro- and nano-molding. More particularly, the invention relates to the application of thin films onto a surface. Even more particularly, the invention relates a method of formation of low-stress and high-optical-index films by chemical vapor deposition (CVD).

Though the invention has applications beyond this representative example, a synopsis of imaging sensor technologies will be helpful. Charge-coupled devices (CCDs) have appeared in imaging devices for over thirty years. The primary advantage being that they process a high percentage of the incoming light which is also referred to as having a high fill factor. Manufacturers would like to switch to CMOS image sensors which would be faster, more flexible, less power intensive, and manufacturable without specialized fabrication facilities. Increasing the detection efficiency of the CMOS image sensor would allow CMOS sensors to further displace CCDs from image acquisition applications. Miniaturizing the electronics integrated alongside the optically active regions is one way to increase the optical efficiency but results in an increase in manufacturing cost. Guiding more light to the optically active surface with optical elements would increase efficiency without creating a reliance on more expensive finer linewidth tooling.

FIG. 1A shows a cross-sectional view of an existing method of increasing the detection efficiency of CMOS image sensors. The detectors 102 are generally manufactured in a two dimensional array located at the interface between two materials, in this case a substrate material and a layer of glass. A matching array of lenses 114 can be placed above the detectors to help guide more light to the detector. Not shown are electrical connections for reading out the signals generated by the detectors. A line incident from above is shown indicating a path of illumination. The path bends upon entering the plano-convex silicon dioxide lens and executes a path 126 distinct from the dashed line. Without the presence of a lens, the illumination executes the path 132 which leads to an adjacent detector. This is undesirable because it results in a detected image which has a less crisp image.

Refractive and reflective optical elements typically employ an interface between two regions of differing refractive indices. The interface is usually smooth down to and including length scales similar to the working optical wavelengths. Making the regions including the interface free of defects helps reduce optical scattering which, in the case of image acquisition, may result in loss of signal and cross-talk between cells. Deposition techniques must be developed which support these design criteria.

Conventional thermal CVD processes supply reactive gases to the substrate surface where the heat from the surface induces chemical reactions to produce a film. Improvements in deposition rate and film properties have been achieved through the use of plasma sources to assist the chemical reactions. Plasma enhanced CVD (PECVD) techniques promote excitation and dissociation of the reactant gases by the application of radio frequency (RF) energy to a reaction zone near the substrate surface, thereby creating a plasma. The high reactivity of the species in the plasma reduces the energy required to activate a chemical reaction. This effectively lowers the substrate temperature required for PECVD processes as compared to conventional thermal CVD processes. Reducing the substrate temperature is attractive because it lowers the chances of diffusion or other mass transport effects which may cause a reduction in the yield of the manufacturing process.

Further improvements have been enabled by another plasma technique known as high density plasma chemical vapor deposition process (HDP-CVD). HDP-CVD allows the use of lower partial pressures of reactant gases while maintaining a higher ionic concentration. HDP-CVD also allows the accelerating energy to be controlled independently of the ionization energy, and enables the reactant ions to become both the reactive and bombarding species. This has been shown to result in improved gap-fill, therefore the technique is particularly important when forming films on patterned surfaces.

A material commonly used in the fabrication of integrated devices is silicon nitride. When used to create optical elements, the higher index of refraction compared to silicon dioxide provides the ability to control electromagnetic radiation of many wavelengths including those visible to the human eye. However, the high stress of traditionally deposited silicon nitride on a silicon base substrate can result in imperfections including particulates which may result from delamination.

As this optical example indicates, there remains a general need in the art for methods of depositing high density silicon nitride and related materials onto substrates with reduced film stress.

BRIEF SUMMARY OF THE INVENTION

The present invention pertains to methods of forming a low-stress multi-layer film on a substrate using an HDP-CVD process at reduced deposition temperatures. All references to stress (unless otherwise indicated) refer to the stress present in a film after the deposition is complete and the substrate is returned to room temperature. Low-stress multi-layer films grown according to embodiments of the present invention include a silicon oxide lining layer, a silicon oxynitride lining layer and a silicon oxynitride bulk gap-fill layer. The first lining layer is formed using a process gas containing a silicon source and an oxygen source while the second lining layer and bulk gap-fill layer are formed using a silicon source, an oxygen source and a nitrogen source.

In embodiments, the formation of the three layers occurs while maintaining a mean pressure within the chamber of about 15 mTorr or less and maintaining a mean substrate temperature of 500° C. or less. The second lining layer is deposited while applying little or no substrate bias power and the bulk gap-fill layer is deposited during application of a substrate bias power. Accordingly, the deposition to sputter ratio may be 50:1 or more during formation of the second lining layer and may be between about 2:1 and 6:1 during formation of the bulk gap-fill layer. The first lining layer may be grown with or without a substrate bias power. The invention further discloses a first lining layer with a thickness of between 50 Å and 300 Å and a second lining layer having a thickness of between 50 Å and 1000 Å, between 200 Å and 800 Å or between 400 Å and 600 Å, in different embodiments.

Furthermore, the invention pertains to the formation of bulk gap-fill layers with refractive indices above that of silicon dioxide for optical radiation with wavelengths of about 633 nm. A refractive index of a bulk gap-fill layer for this type of radiation may be between 1.50 and 2.00, may be between 1.55 and 1.90 or may be between 1.60 and 1.80, in different embodiments.

Specific source gases present in a further embodiment include diatomic oxygen ($O_2$), silane ($SiH_4$) and diatomic nitrogen ($N_2$). The ratio of the oxygen flow rate to the silane flow rate may be between 0.45:1 and 0.7:1 and the ratio of the nitrogen flow rate to the silane flow rate may be about 5:1 or above. The process gas may further include a fluent gas such as argon, neon, and helium during the growth of some or all of the layers.

In another embodiment the mean substrate temperature is between about 300° C. and 400° C. during formation of the multi-layer film. The multi-layer film may have a film stress which is about 300 MPa or below, 200 MPa or below or 100 MPa or below, in different embodiments. This stress, when present, may be compressive or tensile. The total thickness of the multi-layer film may be greater than 1 μm.

The present invention further pertains to methods of depositing low stress multi-layer films similar to those described above on trench geometries formed in a silicon oxide film on a substrate. These trench geometries may be filled with the multi-layer films to create an optical via over an optical detector which can assist with the confinement or control of incident radiation.

DETAILED DESCRIPTION OF THE INVENTION

The present invention relates to methods of forming films with higher index of refraction than silicon dioxide with low film stress. The reduced stress films are capable of being deposited onto blanket or patterned substrates with excellent gap-fill and low defectivity. The method of reducing stress in the films involves two techniques: depositing the film at reduced substrate temperature and depositing first and second lining layers prior to depositing the bulk gap-fill layer. A high density plasma (HDP) is used to enhance gap-fill but also to allow deposition at the reduced substrate temperatures.

Low-stress films deposited according to embodiments of the invention may exhibit a reduced particle count as determined by unpatterned and patterned optical inspection methods. Applications which benefit from low defectivity, low stress, and relatively homogeneous gap-filling capabilities will benefit from these films. A particular class of applications which will benefit from embodiments of the invention is the production of optical elements.

An illustrative example of the utility of the films grown according to embodiments of the invention involves the effort to increase the optical efficiency of complementary metal oxide semiconductor (CMOS) image sensors which will allow them to compete even more favorably with charge-coupled devices (CCDs). CMOS sensor competitiveness will also be helped by a reduction in the cross talk between adjacent pixels. CMOS sensors, unlike CCDs, do not possess a suitable position for a photo shield because the metal lines for reading the sensors often interfere with the shield layout. Though CCDs have enough space for a photo shield, the techniques described throughout should not be associated only with CMOS image sensors. The invention can be used in many optoelectronic devices and may be used in CCDs to replace or augment the photo shield.

Figure 1A:
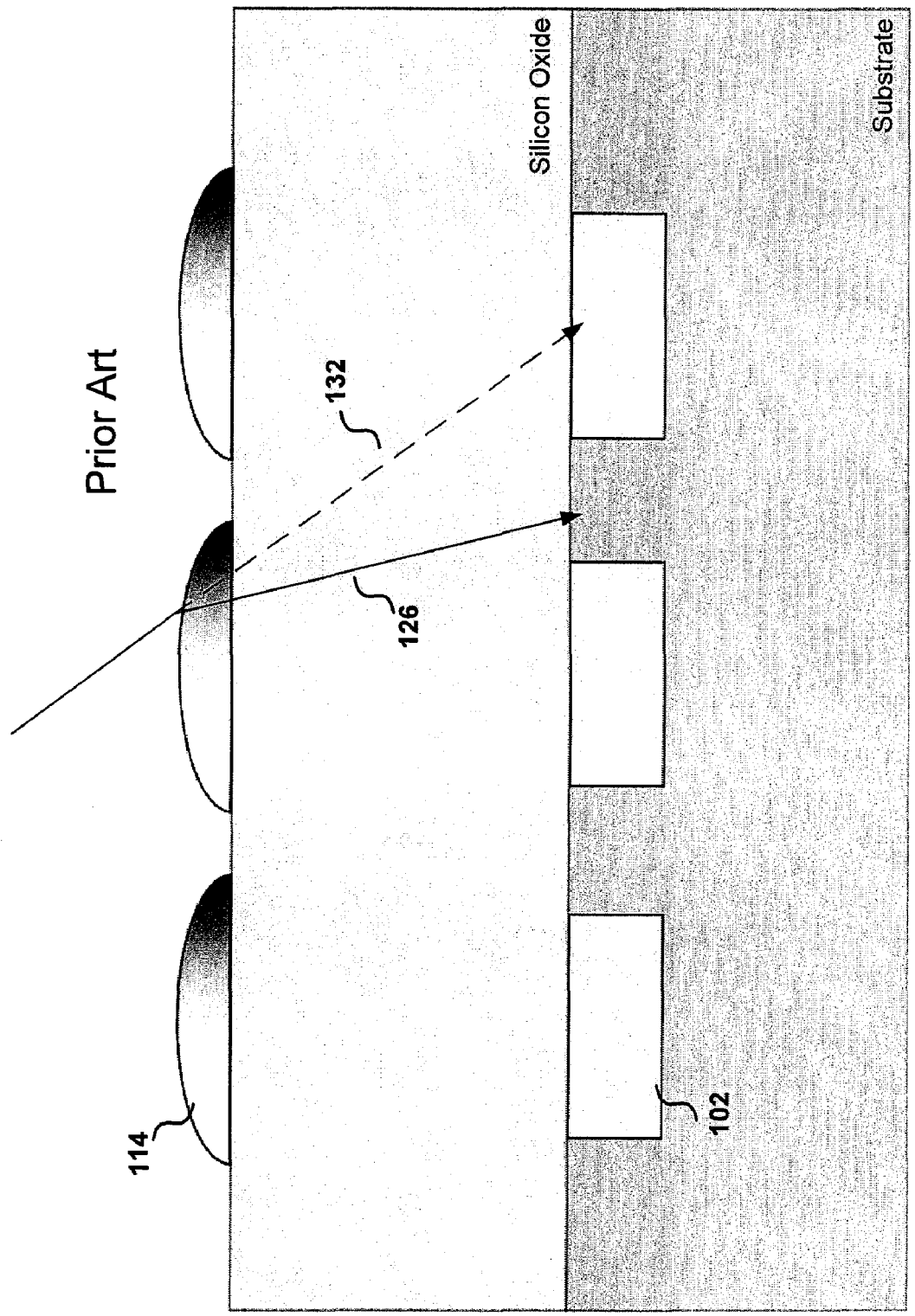
FIG. 1A is a cross-sectional view of a prior art detector implementing plano-convex lenses.
Figure 1B:
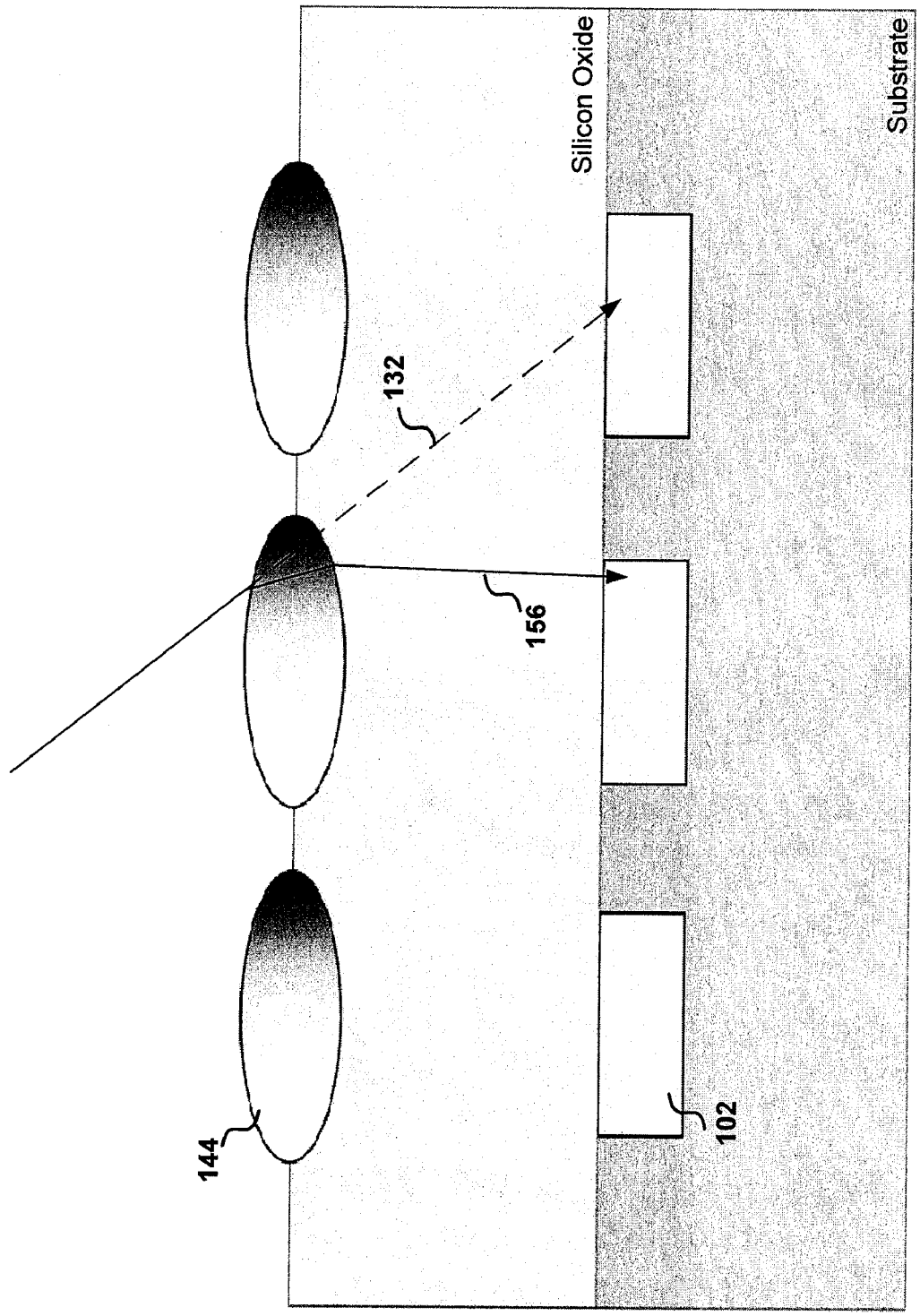
FIG. 1B is a cross-sectional view of a prior art detector implementing biconvex lenses.

Revisiting FIG. 1A, integrating optical elements 114 can help reduce the probability of stray light being detected by an adjacent sensor. These optical elements are plano-convex and can be made of silicon dioxide. However, they can also be made from lower or higher index material than silicon dioxide and still provide advantages. As an example, a biconvex lens can be substituted for lens 114 by depositing a material with higher refractive index than silicon oxide onto an appropriately patterned $SiO_2$ layer as shown in FIG. 1B. The light ray incident from the same angle as that shown in FIG. 1A now bends twice, once upon entering the biconvex lenses 144 and once upon exiting. The total deflection is greater in this case and may result not only in avoiding an adjacent detector but in impinging the preferred detector. An aspect of the invention is depositing high index material onto a patterned substrate as required to form optical arrangements such as FIG. 1B.

Beyond simple plano-convex and biconvex lenses, their exist more complex focusing elements which possess steeper walls benefiting more substantially from the gap-fill aspect of the present invention. For example, a Fresnel lens may be used in place of simpler lenses. Even more generally, these optical elements do not need to be restricted to a refractive mechanism nor is it necessary that they be capable of imaging a source. The primary desirable trait is that the light hitting the appropriate detector is maximized by redirecting light which would have missed the detector.

Another choice of optical element which possesses these characteristics is an optical waveguide. Optical waveguides conduct light in an optical core of higher index of refraction surrounded by a cladding of lower index of refraction. Confinement is achieved as long as the angle, θ, a ray of light makes with the plane of the interfacial surface obeys the following inequality.

$$\theta \leq \cos^{-1}\left[\frac{n_{cladding}}{n_{core}}\right]$$

which depends on the index of refractions of the cladding and the core.

Figure 2:
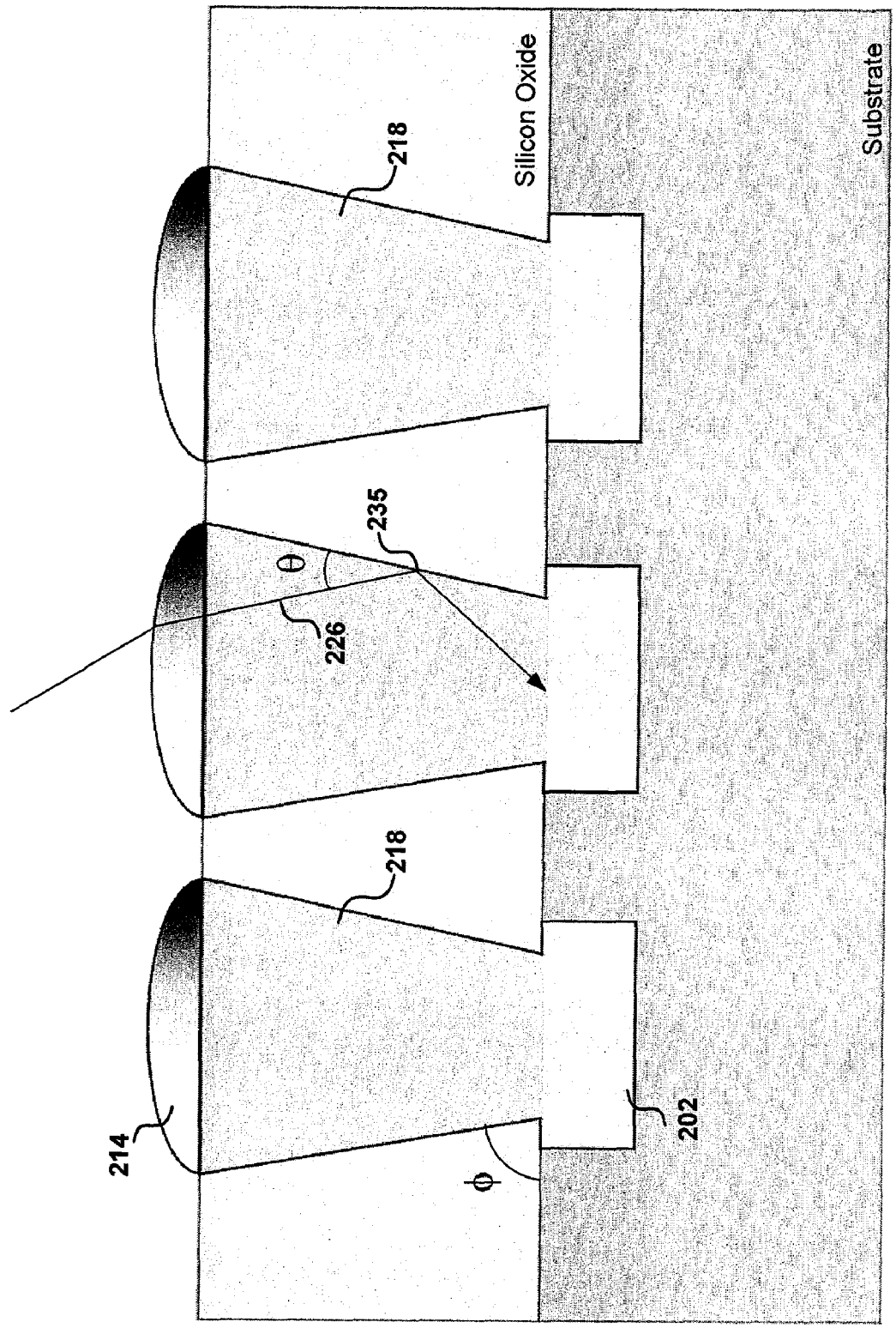
FIG. 2 is a cross-sectional view of integrated vertical waveguides according to embodiment of the invention.

An optical architecture which incorporates this technique and benefits from the improved gap-fill of the present invention is shown in FIG. 2. The optical arrangement is shown with optional lenses 214 on top of optical vias 218, both of which possess higher indices of refraction than silicon dioxide in one embodiment. These vias are formed by etching trenches into the silicon oxide and depositing material of higher index material into the trench. The term trench is used here with no implication that the etched geometry has a large horizontal aspect ratio. From above the trenches may appear circular, oval, polygonal, rectangular, or a variety of other shapes. These vias form the optical core and the cladding is the layer of silicon oxide. The light ray incident from the same angle as that shown in FIGS. 1A and 1B now bends once 226 and then experiences a total internal reflection 235 which prevents the light ray from missing the detector 202.

Silicon nitride is a particularly desirable material to use for an optical waveguide such as that depicted in FIG. 2 due to its high refractive index (n=2.05) compared with silicon dioxide (n=1.46). However, an optical quality silicon nitride film deposited on a silicon substrate can develop a substantial film stress leading to high defect counts. Stress stems from deposition conditions including substrate temperatures which often exceed 600° C. The large difference between the coefficients of thermal expansion (CTEs) of silicon nitride and silicon contributes to a high film stress once the deposition is complete and the substrate is cooled. In addition to the different CTEs, film stiffness will also play a role. A stiff film may form cracks or other defects upon cool-down, whereas a compliant film may accommodate the change.

Delamination and increased particle count have been linked to the above effects which threatens the utility of silicon nitride films in optical elements. Smooth interfaces and a general lack of imperfections is important when creating integrated devices which include optical components. These imperfections create the opportunity for optical scattering. Scattering centers in the via, at the interface, and even outside the via can interact with passing electromagnetic radiation which may cause a loss of confinement.

If not for the high stress it would be desirable to use pure silicon nitride for the core since its index of refraction is about 2.05 compared with 1.46 for silicon dioxide. As a lower stress alternative, silicon oxynitride (SiON) may be deposited which reduces both the index of refraction and the stress of the deposited film. In addition to allowing the coefficient of thermal expansion to be reduced, the introduction of oxygen can create a more flexible bonding arrangement which may be attributable to the presence of Si—O—Si bridge bonds. The flexibility may increase as the portion of oxygen in the film is increased.

Reducing the optical via index of refraction reduces the maximum angle, $\theta_{max}$, of a ray that will still result in a total internal reflection. Table I helps evaluate the impact of this compromise by indicating the relationship between values of the index of SiON core and the maximum angle, $\theta_{max}$. The index of refraction for the $SiO_2$ film is assumed to be 1.46 for these calculations. Films of silicon oxynitride deposited possess indices of refraction between about 1.5 and about 2.0, about 1.55 and about 1.9 or about 1.6 and about 1.8 in different embodiments of the present invention.

TABLE I

Maximum Internal Reflection Angle for different core indices of refraction

| SiON (optical core) index of refraction | $\theta_{max}$ (deg) |
| --- | --- |
| 1.5 | 13.3 |
| 1.6 | 24.1 |
| 1.7 | 30.8 |
| 1.8 | 35.8 |
| 1.9 | 39.8 |
| 2.0 | 43.1 |

Even in the case of a SiON index of 1.5, a glancing angle of above 10° will still result in total internal reflection. The presence of a lens, as shown in the embodiment of FIG. 2, can be used to reduce the angle of the light path at the reflection point 235 which can partially compensate for a low cladding index. The via angle, φ, should be close to 90° in order to increase the probability that the light ray 226 has a small impact angle, θ. In an embodiment, φ is between about 80° and 90°.

High density plasma processes are useful in depositing the SiON films because they allow the use of reduced substrate temperatures and enhance the ability to fill gaps. As used herein, a high-density-plasma process is a plasma CVD process that employs a plasma having an ion density on the order of $10^{11}$ ions/cm$^3$ or greater and has an ionization fraction (ion/neutral ratio) on the order of $10^{-4}$ or greater. Typically HDP-CVD processes include simultaneous deposition and sputtering components. Some HDP-CVD processes embodied in the present invention are different from traditional HDP-CVD processes which may be optimized for gap-fill. In some steps and embodiments, silicon oxynitride films are achieved with substantially reduced (<10% of total plasma power) substrate bias power and thus create less sputtering than HDP-CVD processes that employ significant bias power. Despite this departure from traditional HDP process parameters, a scalar characterization involving sputtering and deposition rates will be useful and is defined below.

The relative levels of the combined deposition and sputtering characteristics of a high-density plasma may depend on such factors as the gas flow rates used to provide the gaseous mixture, the source power levels applied to maintain the plasma, the bias power applied to the substrate, and the like. A combination of these factors may be conveniently characterized by a "deposition-to-sputter ratio" defined as $$\frac{\text{(net deposition rate)} + \text{(blanket sputtering rate)}}{\text{(blanket sputtering rate)}}.$$

The deposition-to-sputter ratio increases with increased deposition and decreases with increased sputtering. As used in the definition of the deposition-to-sputter ratio, the "net deposition rate" refers to the deposition rate that is measured when deposition and sputtering are occurring simultaneously. The "blanket sputter rate" is the sputter rate measured when the process recipe is run without deposition gases (leaving nitrogen and a fluent for example). The flow rates of the remaining gases are increased, maintaining fixed ratios among them, to attain the pressure present in the process chamber during normal processing.

Other equivalent measures may be used to quantify the relative deposition and sputtering contributions of the HDP process, as is known to those of skill in the art. A common alternative ratio is the "etching-to-deposition ratio"

$$\frac{\text{(source-only deposition rate)} - \text{(net deposition rate)}}{\text{(source-only deposition rate)}},$$

which increases with increased sputtering and decreases with increased deposition. As used in the definition of the etching-to-deposition ratio, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of deposition-to-sputter ratios. While deposition-to-sputter and etching-to-deposition ratios are not precise reciprocals, they are inversely related and conversion between them will be understood to those of skill in the art.

Typical HDP-CVD processes are geared towards the gap-fill of trench geometries. In those processes, a substrate bias RF power is used to accelerate ions toward the substrate which produces a narrow range of approach trajectories. This narrowing combined with sputtering activity allows gaps to be filled before the top corners of a growing via come together to form and maintain a void. Deposition-to-sputter ratios in such gap fill applications are often in the range of three to ten, with some exotic applications having deposition-to-sputter ratios out to twenty five. Silicon oxynitride films grown according to embodiments of the present invention are produced with an HDP-CVD process using little or no substrate bias power. The blanket sputtering rate under these conditions is low and difficult to measure, but the deposition-to-sputter ratio can generally be expected to be above about fifty or one hundred in different embodiments.

Aspects of the invention lessen the stress through the use of high density plasma techniques to form a silicon oxynitride film at a substrate temperature below 500° C. or between 300° C. and 400° C. in different embodiments. The thermal control of the substrate may be provided during deposition by flowing helium at the back of the substrate.

Figure 3:
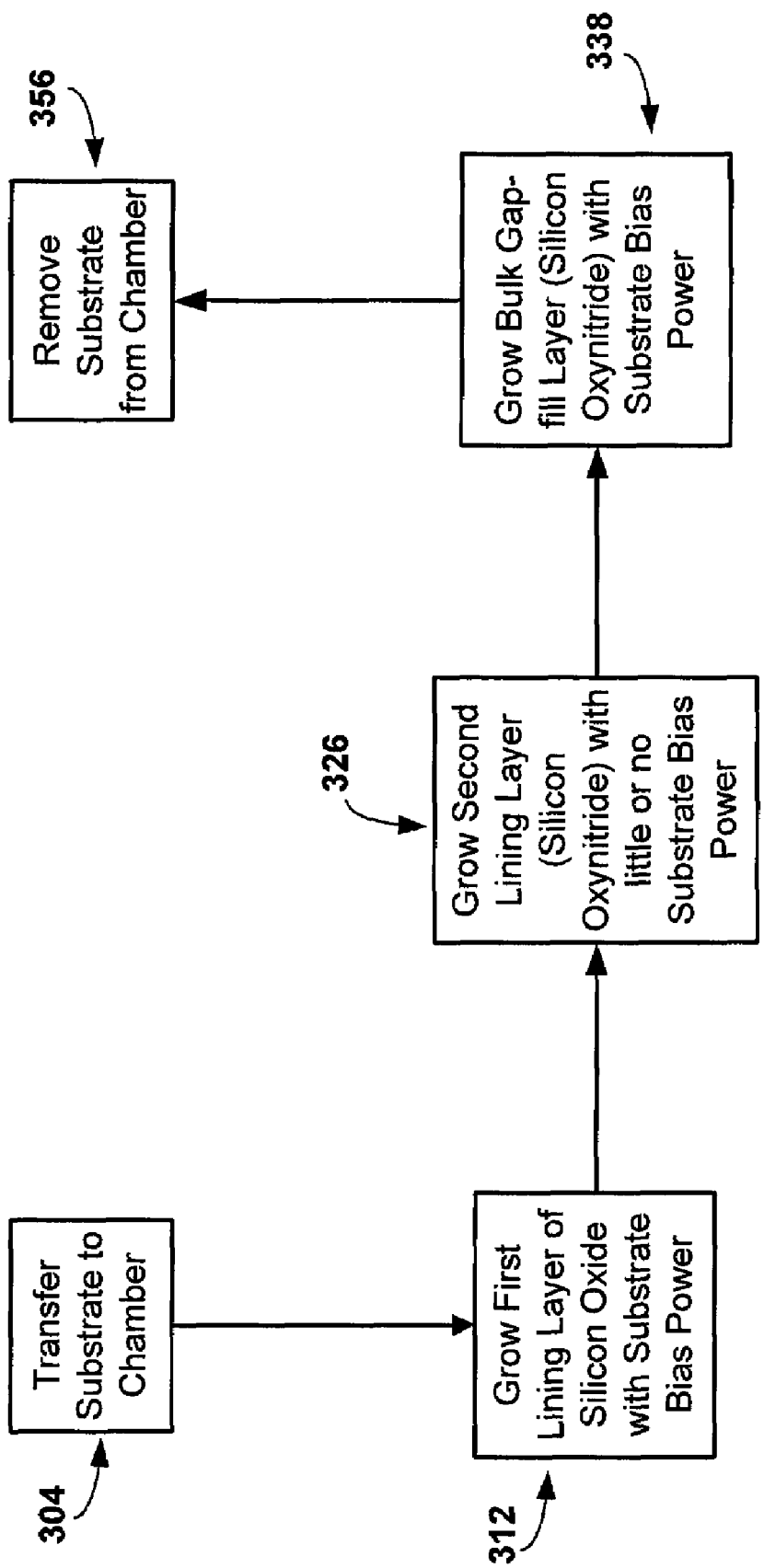
FIG. 3 is a flow chart indicating the steps involved in growing a film suitable for forming vertical waveguides.
Figure 4A:
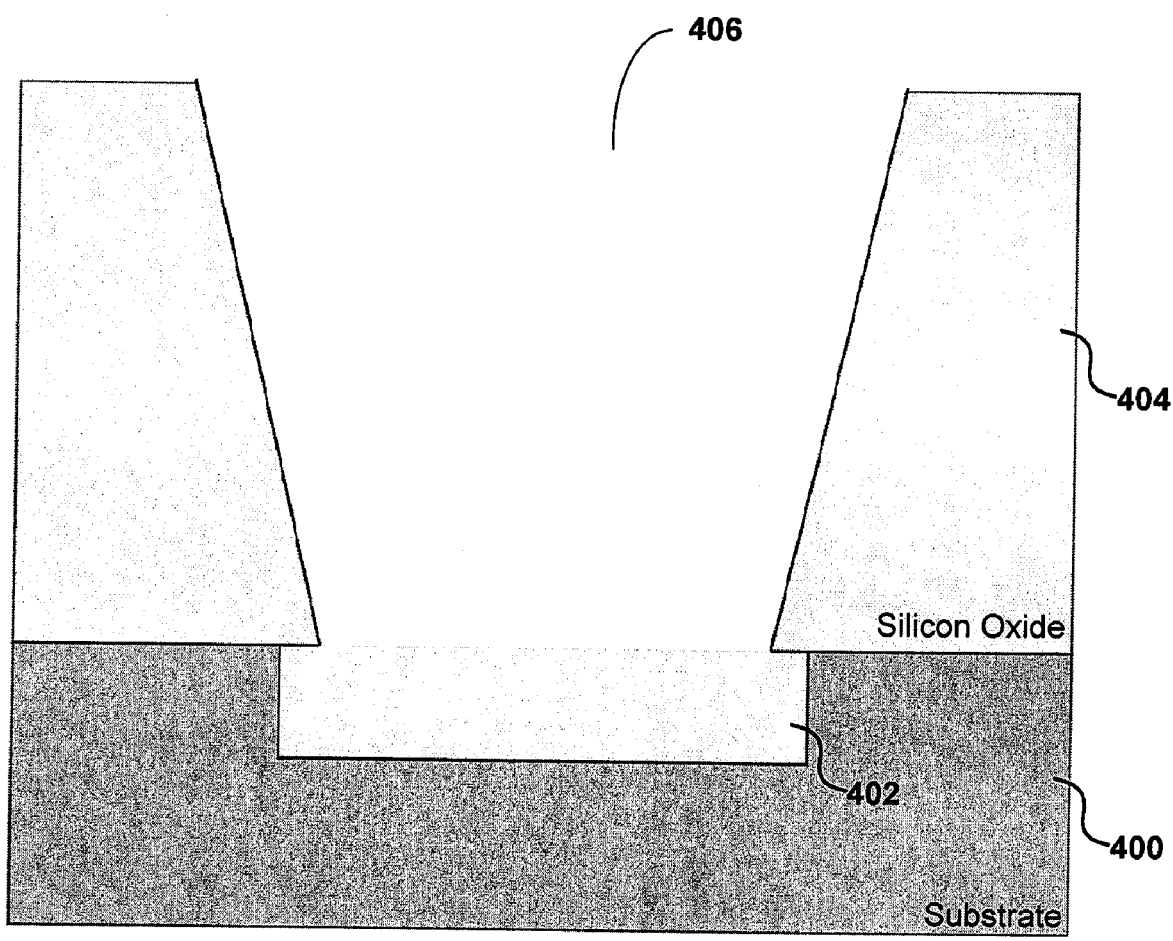
FIG. 4A is a cross-sectional view of a trench before deposition of a film grown according to the embodiments of the invention.
Figure 4B:
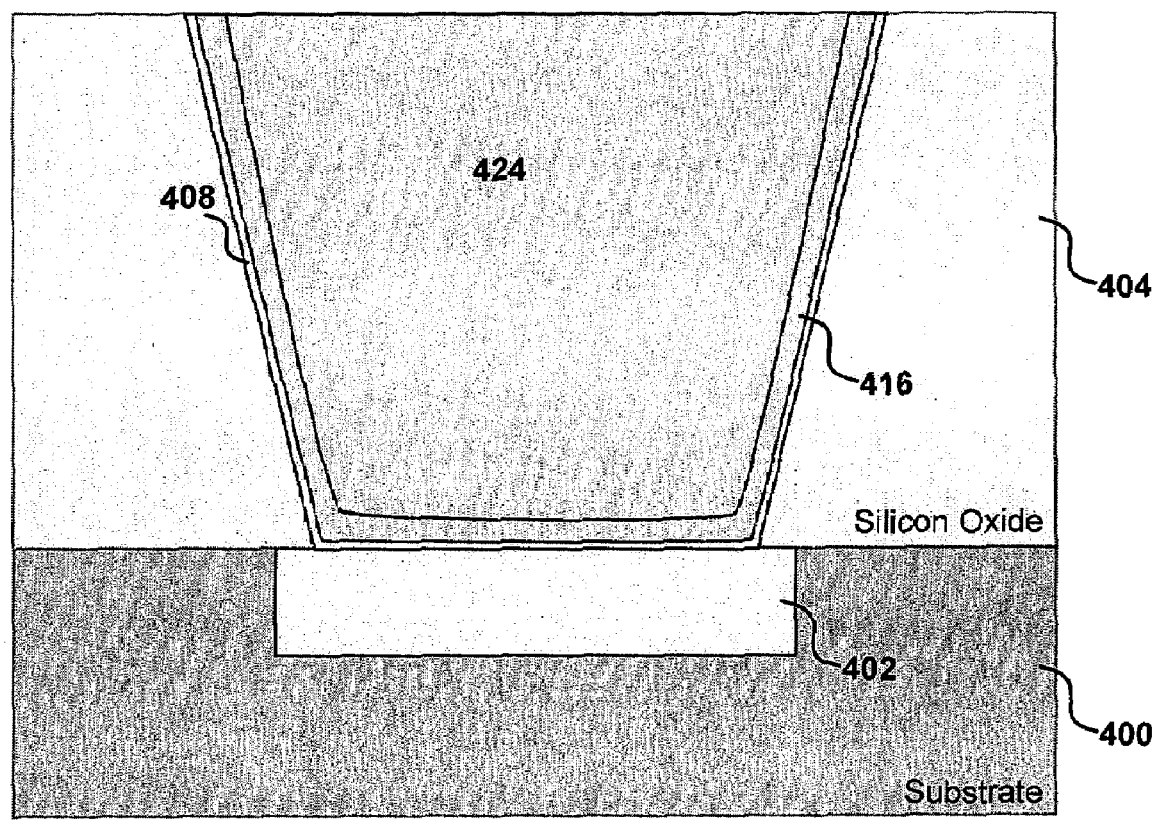
FIG. 4B is a cross-sectional view of the substrate of FIG. 4A onto which a three layer film has been added according to some embodiments of the invention represented in the flow chart of FIG. 3.

In order to better understand and appreciate the invention, reference is now made to FIGS. 3 and 4 which show a process of growing a multi-layered optical via according to embodiments of the invention and a cross-sectional view of a device including the optical via, respectively. As shown in FIG. 4, the device includes two separate lining layers and a bulk gapfill layer. One of the purposes of the lining layers is to accommodate the thermal contraction of the relatively stiff bulk gap-fill layer. The second lining layer is made more compliant by reducing sputtering during its deposition. Sputtering can change the local bonding structure and may reduce the population of Si—O—Si bridge bonding sites.

As shown in these figures a substrate 400 is transferred into a deposition chamber (step 304). In the optical example alluded to earlier, the substrate may have an array of optical detectors 402 and a layer of silicon oxide 404 patterned and etched to form trenches 406.

The plasma is started with a substrate bias power. In an embodiment, diatomic oxygen ($O_2$) is used as an oxygen source, silane ($SiH_4$) is used as a silicon source and diatomic nitrogen ($N_2$) is used as a nitrogen source. With this choice of gas precursors, silane and diatomic oxygen are introduced into the chamber to initiate growth of a first lining layer in step 312. This first lining layer is predominantly silicon oxide and may be grown to a thickness ranging from 50 Å to 300 Å. This layer is indicated 408 in a cross-sectional view of the completed structure in FIG. 4B and is thin compared with the dimensions of the trench. Using silicon oxide instead of silicon oxynitride results in a more flexible film further decreasing the magnitude of the multi-layer film stress.

After growing a first lining layer comprising silicon and oxygen 408, the substrate bias power may be eliminated or substantially reduced (e.g. less than 10% of total plasma power) and the diatomic nitrogen flow is initiated resulting in the growth of a second lining layer (step 326). The second lining layer 416 is silicon oxynitride and the growth may continue until the second lining layer has a thickness between 50 Å and 1000 Å, between 200 Å and 800 Å or between 400 Å and 600 Å in different embodiments. The flexibility of the second lining layer may not be as high as the first lining layer, but is higher than the bulk gap-fill layer as a result of the reduced bias power. Because there is little or no bias power during formation of lining layer 416, its deposition-to-sputter ratio may be 50:1 or more.

Following the growth of the second lining layer 416, an increased bias power is applied to the substrate to decrease the deposition-to-sputter ratio and grow the bulk gap-fill layer in step 338. Once the desired thickness of the bulk gap-fill layer is achieved, the flow of precursor gases is stopped, the bias power is removed and the power to the rest of the HDP excitation sources is removed. The substrate is removed from the deposition chamber in step 356. Excess material may be removed by polishing or etching in a subsequent step.

The bulk gap-fill layer 424 is grown with the substrate bias power supplied in order to provide better gap-fill. The deposition-to-sputter ratio may be between about 2:1 and 6:1 and the thickness of the bulk gap-fill layer may range upward from about 0.1 µm and will typically not be thicker than 2 µm. In an embodiment, the thickness of the multi-layer film is greater than or about 1 µm. The bulk gap-fill layer is the best of the three at filling the trenches without forming voids but will have the highest intrinsic stress. The first two layers are intended to improve adhesion and absorb some of the stress associated with the bulk gap-fill layer thereby reducing the incidence of defects including defects found with optical inspection techniques.

Deviations from the steps shown in FIG. 3 are possible within the scope of the invention. A representative deviation includes the flow of a fluent gas to increase the density of the plasma. The flow of a fluent gas (e.g. argon, neon, helium) may be present during any of steps 312 through 338 and may help to increase the ionization and dissociation probabilities within the plasma. The use of argon as a fluent gas during the growth of the second lining layer has been linked to a small increase in the stress of the multi-layer film. This may be due to an increase in sputtering resulting from the higher atomic mass of argon than other gases present.

The timing and order of initiation and termination of gas precursor flows, HDP-CVD top and side plasma power and substrate bias power may vary within the scope of the invention. In one embodiment, for example, the silane is terminated before the flows of oxygen and nitrogen. In another deviation from FIG. 3, the first lining layer may be grown with no substrate bias power without significantly affecting the multi-layer film stress.

The ratio of gas flow rates of oxygen to silane may range from about 0.45:1 to about 0.7:1. Higher ratios may impede the film growth rate and result in more unused oxygen precursor while lower ratios result in a silicon rich film which would change the optical properties. During the SiON film growth (326 and 338), the ratio of gas flow rates of nitrogen to silane range from 5:1 upward. The mean pressure in the processing chamber is maintained at or below 15 mTorr. During the growth of the first and second lining layers, the deposition-to-sputter ratio will be about 50:1 or greater. During the growth of the bulk gap-fill layer, the deposition-to-sputter ratio may be between about 2:1 and 6:1.

In order to confirm the benefits of certain embodiments of the invention, experiments were performed comparing the film stress of an HDP-CVD silicon oxynitride film deposited with and without the two stress-relieving layers. The substrate was processed in an Ultima HDP chamber outfitted for 300 mm substrates. The substrate was maintained at 350° C. during HDP-CVD deposition and the total source plasma RF power applied was 10.6 Watts/cm$^2$ (7500 Watts) excluding bias power. The first lining layer was grown with a substrate bias power of about 5.0 Watts/cm$^2$ (3500 Watts) and the second lining layer was grown without a substrate bias power. Bias power in the range 3.5-10.0 Watts/cm$^2$ (2500-7000 Watts over a 300 mm diameter wafer) was applied to the substrate during growth of the silicon oxynitride of the bulk gap-fill layer. The thickness of the first and second lining layers were about 200 Å and 500 Å, respectively. The thickness of the bulk gap-fill layer was about 2.0 µm.

Figure 5:
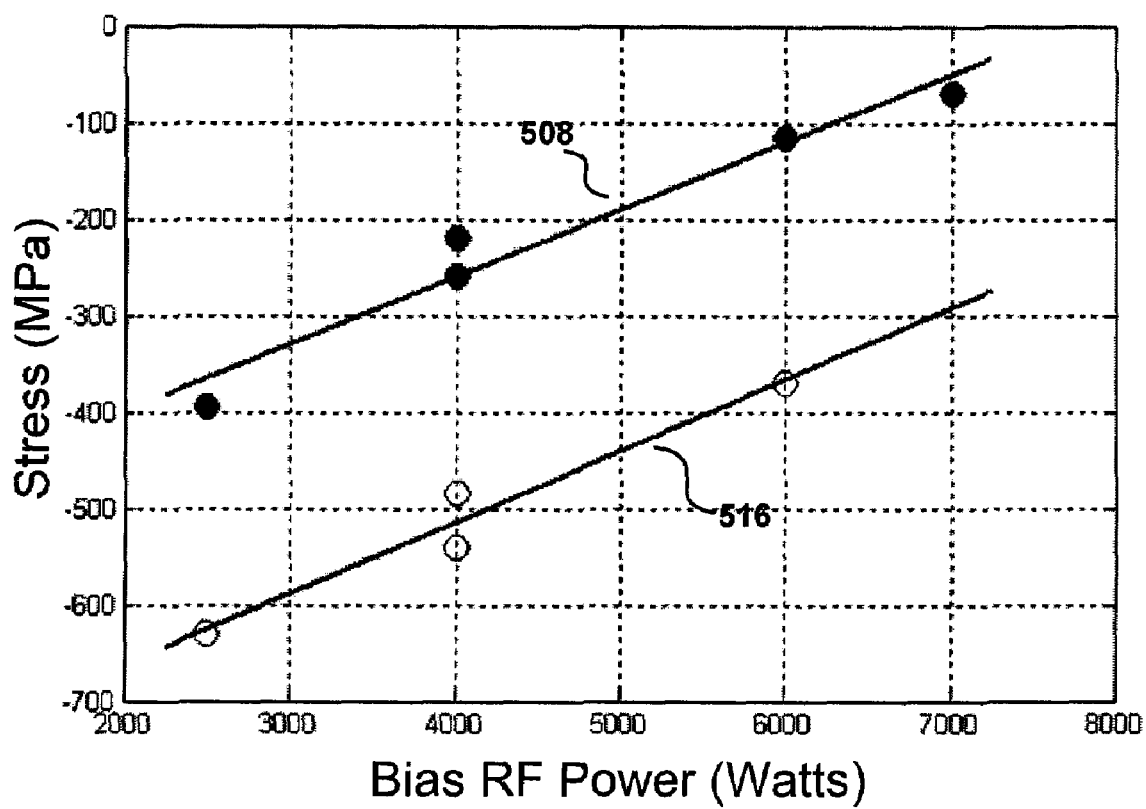
FIG. 5 is a plot of the film stress of silicon oxynitride films grown with and without silicon oxide lining layers.

The multi-layer film stress was compressive (negative) under all circumstances and is graphed in FIG. 5. Film stress was measured by equipment which determine the radius of curvature of the substrate before and after deposition. The difference of the reciprocals of the two values is proportional to the film stress. As the substrate bias power is raised, the properties of the bulk gap-fill layer are changed which decreases the compressive stress after cooling. Independent of the influence of bias power, the inclusion of the first and second lining layers resulted in a significant reduction 508 in the magnitude of the multi-layer film stress compared to films grown without the first and second lining layers 516. The magnitude of the stress of the multi-layer film may be below 300 MPa, may be below 200 MPa or may be below 100 MPa in different embodiments.

The examples described with reference to the present invention have involved vertical waveguides designed to channel light to a preferred optical sensor. It should be noted that the aspects of the invention including but not limited to the reduced stress and reduced defectivity would provide benefits for horizontal waveguides as well. In fact, the deposition techniques presented herein would provide benefits whenever silicon oxynitride is being deposited onto a substrate, particularly a patterned substrate.

Exemplary Substrate Processing System

Figure 6A:
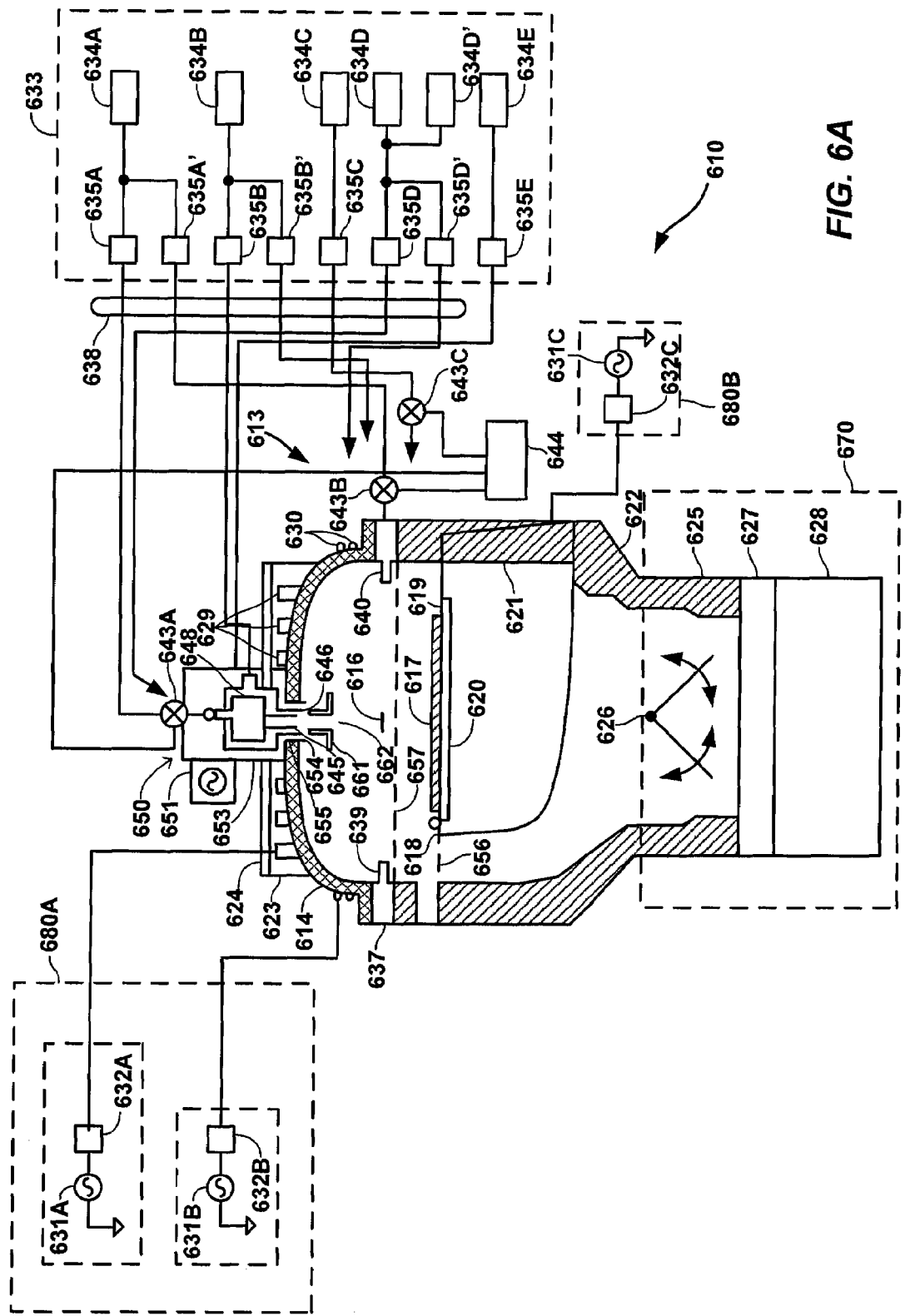
FIG. 6A is a simplified diagram of one embodiment of a high-density-plasma chemical-vapor-deposition system with which methods of the invention may be implemented.
Figure 6B:
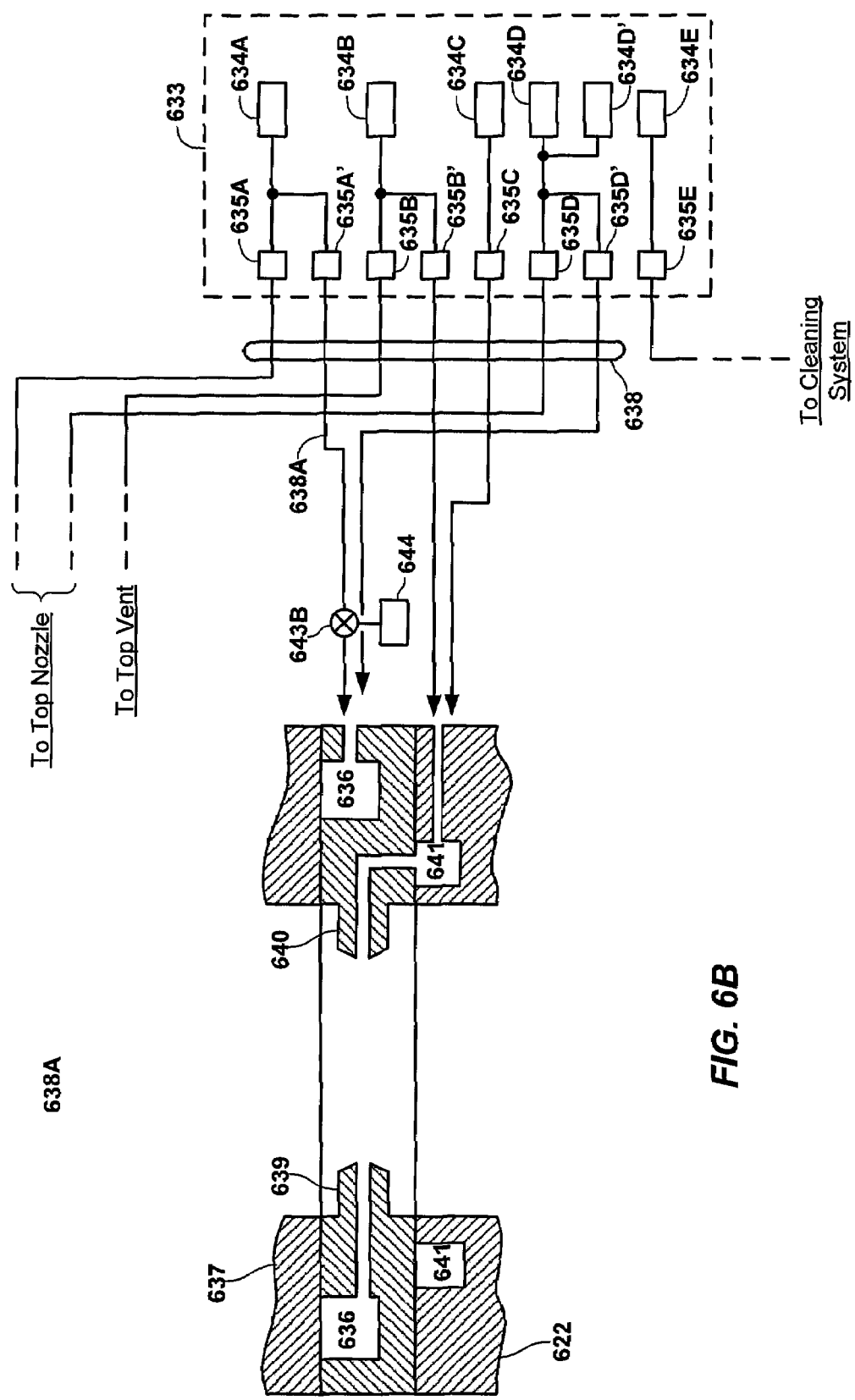
FIG. 6B is a simplified cross section of a gas ring that may be used in conjunction with the exemplary processing system of FIG. 6A.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 6A and 6B below. FIG. 6A schematically illustrates the structure of such an HDP-CVD system 610 in one embodiment. The system 610 includes a chamber 613, a vacuum system 670, a source plasma system 680A, a substrate bias plasma system 680B, a gas delivery system 633, and a remote plasma cleaning system 650.

The upper portion of chamber 613 includes a dome 614, which is made of a ceramic dielectric material, such as aluminum oxide or aluminum nitride. Dome 614 defines an upper boundary of a plasma processing region 616. Plasma processing region 616 is bounded on the bottom by the upper surface of a substrate 617 and a substrate support member 618.

A heater plate 623 and a cold plate 624 surmount, and are thermally coupled to, dome 614. Heater plate 623 and cold plate 624 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 613 includes a body member 622, which joins the chamber to the vacuum system. A base portion 621 of substrate support member 618 is mounted on, and forms a continuous inner surface with, body member 622. Substrates are transferred into and out of chamber 613 by a robot blade (not shown) through an insertion/removal opening (not shown) in the side of chamber 613. Lift pins (not shown) are raised and then lowered under the control of a motor (also not shown) to move the substrate from the robot blade at an upper loading position 657 to a lower processing position 656 in which the substrate is placed on a substrate receiving portion 619 of substrate support member 618. Substrate receiving portion 619 includes an electrostatic chuck 620 that secures the substrate to substrate support member 618 during substrate processing. In a preferred embodiment, substrate support member 618 is made from an aluminum oxide or aluminum ceramic material.

Vacuum system 670 includes throttle body 625, which houses twin-blade throttle valve 626 and is attached to gate valve 627 and turbo-molecular pump 628. It should be noted that throttle body 625 offers minimum obstruction to gas flow, and allows symmetric pumping. Gate valve 627 can isolate pump 628 from throttle body 625, and can also control chamber pressure by restricting the exhaust flow capacity when throttle valve 626 is fully open. The arrangement of the throttle valve, gate valve, and turbo-molecular pump allow accurate and stable control of chamber pressures up to about 1 millitorr to about 2 torr.

The source plasma system 680A includes a top coil 629 and side coil 630, mounted on dome 614. A symmetrical ground shield (not shown) reduces electrical coupling between the coils. Top coil 629 is powered by top source RF (SRF) generator 631A, whereas side coil 630 is powered by side SRF generator 631B, allowing independent power levels and frequencies of operation for each coil. This dual coil system allows control of the radial ion density in chamber 613, thereby improving plasma uniformity. Side coil 630 and top coil 629 are typically inductively driven, which does not require a complimentary electrode. In a specific embodiment, the top source RF generator 631A provides up to 5,000 watts of RF power at nominally 2 MHz and the side source RF generator 631B provides up to 7,500 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A substrate bias plasma system 680B includes a bias RF ("BRF") generator 631C and a bias matching network 632C. The bias plasma system 680B capacitively couples substrate portion 617 to body member 622, which act as complimentary electrodes. The bias plasma system 680B serves to enhance the transport of plasma species (e.g., ions) created by the source plasma system 680A to the surface of the substrate. In a specific embodiment, the substrate bias RF generator provides up to 10,000 watts of RF power at a frequency of about 13.56 MHz.

RF generators 631A and 631B include digitally controlled synthesizers. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 632A and 632B match the output impedance of generators 631A and 631B with their respective coils 629 and 630. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 633 provides gases from several sources, 634A-634E to a chamber for processing the substrate by way of gas delivery lines 638 (only some of which are shown). As would be understood by a person of skill in the art, the actual sources used for sources 634A-634E and the actual connection of delivery lines 638 to chamber 613 varies depending on the deposition and cleaning processes executed within chamber 613. Gases are introduced into chamber 613 through a gas ring 637 and/or a top nozzle 645. FIG. 5B is a simplified, partial cross-sectional view of chamber 613 showing additional details of gas ring 637.

In one embodiment, first and second gas sources, 634A and 634B, and first and second gas flow controllers, 635A' and 635B', provide gas to ring plenum 636 in gas ring 637 by way of gas delivery lines 638 (only some of which are shown). Gas ring 637 has a plurality of source gas nozzles 639 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 637 has 12 source gas nozzles made from an aluminum oxide ceramic.

Gas ring 637 also has a plurality of oxidizer gas nozzles 640 (only one of which is shown), which in one embodiment are co-planar with and shorter than source gas nozzles 639, and in one embodiment receive gas from body plenum 641. In some embodiments it is desirable not to mix source gases and oxidizer gases before injecting the gases into chamber 613. In other embodiments, oxidizer gas and source gas may be mixed prior to injecting the gases into chamber 613 by providing apertures (not shown) between body plenum 641 and gas ring plenum 636. In one embodiment, third, fourth, and fifth gas sources, 634C, 634D, and 634D', and third and fourth gas flow controllers, 635C and 635D', provide gas to body plenum by way of gas delivery lines 638. Additional valves, such as 643B (other valves not shown), may shut off gas from the flow controllers to the chamber. In implementing certain embodiments of the invention, source 634A comprises a silane $SiH_4$ source, source 634B comprises a molecular nitrogen $N_2$ source, source 634C comprises a TSA source, source 634D comprises an argon Ar source, and source 634D' comprises a disilane $Si_2H_6$ source.

In embodiments where flammable, toxic, or corrosive gases are used, it may be desirable to eliminate gas remaining in the gas delivery lines after a deposition. This may be accomplished using a 3-way valve, such as valve 643B, to isolate chamber 613 from delivery line 638A and to vent delivery line 638A to vacuum foreline 644, for example. As shown in FIG. 6A, other similar valves, such as 643A and 643C, may be incorporated on other gas delivery lines. Such three-way valves may be placed as close to chamber 613 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 613 also has top nozzle 645 and top vent 646. Top nozzle 645 and top vent 646 allow independent control of top and side flows of the gases, which improves film uniformity and allows fine adjustment of the film's deposition and doping parameters. Top vent 646 is an annular opening around top nozzle 645. In one embodiment, first gas source 634A supplies source gas nozzles 639 and top nozzle 645. Source nozzle MFC 635A' controls the amount of gas delivered to source gas nozzles 639 and top nozzle MFC 635A controls the amount of gas delivered to top gas nozzle 645. Similarly, two MFCs 635B and 635B' may be used to control the flow of oxygen to both top vent 646 and oxidizer gas nozzles 640 from a single source of oxygen, such as source 634B. In some embodiments, oxygen is not supplied to the chamber from any side nozzles. The gases supplied to top nozzle 645 and top vent 646 may be kept separate prior to flowing the gases into chamber 613, or the gases may be mixed in top plenum 648 before they flow into chamber 613. Separate sources of the same gas may be used to supply various portions of the chamber.

A remote microwave-generated plasma cleaning system 650 is provided to periodically clean deposition residues from chamber components. The cleaning system includes a remote microwave generator 651 that creates a plasma from a cleaning gas source 634E (e.g., molecular fluorine, nitrogen trifluoride, other fluorocarbons or equivalents) in reactor cavity 653. The reactive species resulting from this plasma are conveyed to chamber 613 through cleaning gas feed port 654 by way of applicator tube 655. The materials used to contain the cleaning plasma (e.g., cavity 653 and applicator tube 655)

must be resistant to attack by the plasma. The distance between reactor cavity 653 and feed port 654 should be kept as short as practical, since the concentration of desirable plasma species may decline with distance from reactor cavity 653. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 620, do not need to be covered with a dummy wafer or otherwise protected, as may be required with an in situ plasma cleaning process. In FIG. 6A, the plasma-cleaning system 650 is shown disposed above the chamber 613, although other positions may alternatively be used.

A baffle 661 may be provided proximate the top nozzle to direct flows of source gases supplied through the top nozzle into the chamber and to direct flows of remotely generated plasma. Source gases provided through top nozzle 645 are directed through a central passage 662 into the chamber, while remotely generated plasma species provided through the cleaning gas feed port 654 are directed to the sides of the chamber 613 by the baffle 661.

Those of ordinary skill in the art will realize that processing parameters can vary for different processing chambers and different processing conditions, and that different precursors can be used without departing from the spirit of the invention. Appropriate silicon containing precursors may include trisilylamine (TSA, $(SiH_3)_3N$) and disilane ($Si_2H_6$) in addition to silane. Nitrogen containing precursors may include $N_2O$ and $NO_2$ in addition to diatomic nitrogen. Oxygen containing precursors may include ozone ($O_3$), $N_2O$ and $NO_2$ in addition to diatomic oxygen. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a multi-layer film on a substrate positioned within a processing chamber, the method comprising:
    growing a first lining layer comprising predominantly silicon dioxide by forming a high density plasma from a process gas comprising a silicon source and an oxygen source while maintaining a mean pressure within the chamber of about 15 mTorr or less and maintaining a mean substrate temperature of 500° C. or less;
    growing a second lining layer comprising predominantly silicon oxynitride over the first lining layer by forming a high density plasma from a process gas comprising a silicon source, an oxygen source and a nitrogen source while maintaining a mean pressure within the chamber of about 15 mTorr or less and maintaining a mean substrate temperature of 500° C. or less, wherein a deposition-to-sputter ratio during growth of the second lining layer is at least 50:1;
    growing a bulk gap-fill layer comprising predominantly silicon oxynitride over the second lining layer by forming a high density plasma from a process gas comprising a silicon source, an oxygen source and a nitrogen source while maintaining a mean pressure within the chamber of about 15 mTorr or less and maintaining a mean substrate temperature of 500° C. or less, wherein a deposition-to-sputter ratio during growth of the bulk gap-fill layer is between about 2:1 and 6:1;
    wherein each of the high density plasmas formed to grow the first lining layer, the second lining layer and the bulk gap-fill layer has a density of $10^{11}$ ions/cm$^3$ or greater.

2. A method of forming a plurality of image sensors over a substrate, the method comprising:
    forming a plurality of optical arrangements on a substrate, each of the optical arrangements comprising an optical via formed over an optical detector; wherein the optical vias are formed by:
    etching a trench in a silicon oxide insulating layer formed over the optical detector;
    growing a first lining layer comprising predominantly silicon dioxide in the trench by forming a high density plasma from a process gas comprising a silicon source and an oxygen source while maintaining a mean pressure within the chamber of about 15 mTorr or less and maintaining a mean substrate temperature of 500° C. or less;
    growing a second lining layer comprising predominantly silicon oxynitride over the first lining layer by forming a high density plasma from a process gas comprising a silicon source, an oxygen source and a nitrogen source while maintaining a mean pressure within the chamber of about 15 mTorr or less and maintaining a mean substrate temperature of 500° C. or less, wherein a deposition-to-sputter ratio during growth of the second lining layer is at least 50:1;
    growing a bulk gap-fill layer comprising predominantly silicon oxynitride over the second lining layer by forming a high density plasma from a process gas comprising a silicon source, an oxygen source and a nitrogen source while maintaining a mean pressure within the chamber of about 15 mTorr or less and maintaining a mean substrate temperature of 500° C. or less, wherein a deposition-to-sputter ratio during growth of the bulk gap-fill layer is between about 2:1 and 6:1;
    wherein each of the high density plasmas formed to grow the first lining layer, the second lining layer and the bulk gap-fill layer has a density of $10^{11}$ ions/cm$^3$ or greater.

3. The method of claim 1 wherein the first lining layer has a thickness of between 50 Å and 300 Å and the second lining layer has a thickness of between 50 Å and 1000 Å.

4. The method of claim 1 wherein the oxygen source is diatomic oxygen ($O_2$) flowed with a first gas flow rate, the silicon source is silane ($SiH_4$) flowed with a second gas flow rate and the nitrogen source is diatomic nitrogen ($N_2$) flowed with a third gas flow rate.

5. The method of claim 1 wherein a refractive index of the bulk gap-fill layer is between 1.50 and 2.00 for optical wavelengths near 633 nm.

6. The method of claim 1 wherein the mean substrate temperature is between about 300° C. and 400° C.

7. The method of claim 1 wherein the process gas further comprises a fluent gas selected from argon, neon, and helium flowed with a fourth flow rate during the growth of at least one of the three layers.

8. The method of claim 1 wherein a magnitude of a film stress of the multi-layer film is about 300 MPa or below and may be compressive or tensile.

9. The method of claim 1 wherein a thickness of the multi-layer film is greater than 1 µm.

10. The method of claim 1 wherein little or no substrate bias power is applied during the growth of the second lining layer.

11. The method of claim 3 wherein the second lining layer has a thickness of between 200 Å and 800 Å.

12. The method of claim 3 wherein the second lining layer has a thickness of between 400 Å and 600 Å.

13. The method of claim 4 wherein a ratio of the first gas flow rate to the second gas flow rate is between 0.45:1 and 0.7:1 and a ratio of the third gas flow rate to the second gas flow rate is about 5:1 or above.

14. The method of claim 5 wherein the refractive index of the bulk gap-fill layer is between 1.55 and 1.90 for optical wavelengths near 633 nm.

15. The method of claim 5 wherein the refractive index of the bulk gap-fill layer is between 1.60 and 1.80 for optical wavelengths near 633 nm.

16. The method of claim 2 wherein the first lining layer has a thickness of between 50 Å and 300 Å and the second lining layer has a thickness of between 50 Å and 1000 Å.

17. The method of claim 2 wherein the via angle, $\phi$, is between 80° and 90°.

18. The method of claim 2 wherein the oxygen source is diatomic oxygen ($O_2$) flowed with a first gas flow rate, the silicon source is silane ($SiH_4$) flowed with a second gas flow rate and the nitrogen source is diatomic nitrogen ($N_2$) flowed with a third gas flow rate.

19. The method of claim 2 wherein a refractive index of the bulk gap-fill layer is between 1.60 and 1.80 for optical wavelengths near 633 nm.

20. The method of claim 2 wherein the mean substrate temperature is between about 300° C. and 400° C.

21. The method of claim 2 wherein the process gas further comprises a fluent gas selected from argon, neon and helium with a fourth flow rate during the growth of at least one of the three layers.

22. The method of claim 2 wherein a magnitude of film stress of the multi-layer film is about 300 MPa or below and may be compressive or tensile.

23. The method of claim 2 wherein a thickness of the multi-layer film is greater than 1 μm.

24. The method of claim 2 wherein little or no substrate bias power is applied during the growth of the second lining layer.

25. The method of claim 16 wherein second lining layer has a thickness of between 200 Å and 800 Å.

26. The method of claim 16 wherein second lining layer has a thickness of between 400 Å and 600 Å.

27. The method of claim 18 wherein a ratio of the first gas flow rate to the second gas flow rate is between 0.45:1 and 0.7:1 and a ratio of the third gas flow rate to the second gas flow rate is about 5:1 or above.

* * * * *